United States Patent
Moon et al.

(10) Patent No.: US 11,404,521 B2
(45) Date of Patent: Aug. 2, 2022

(54) DISPLAY APPARATUS INCLUDING POWER SUPPLY LINE AND FAN-OUT PORTION

(71) Applicant: SAMSUNG DISPLAY CO., LTD., Yongin-si (KR)

(72) Inventors: Sangho Moon, Yongin-si (KR); Taejong Eom, Yongin-si (KR); Chungi You, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 156 days.

(21) Appl. No.: 16/866,072

(22) Filed: May 4, 2020

(65) Prior Publication Data
US 2021/0098550 A1    Apr. 1, 2021

(30) Foreign Application Priority Data
Oct. 1, 2019   (KR) .................. 10-2019-0121743

(51) Int. Cl.
  *H01L 29/08*   (2006.01)
  *H01L 27/32*   (2006.01)
  *H01L 51/52*   (2006.01)

(52) U.S. Cl.
  CPC ...... *H01L 27/3276* (2013.01); *H01L 27/3262* (2013.01); *H01L 27/3265* (2013.01); *H01L 51/5246* (2013.01)

(58) Field of Classification Search
  CPC ............. H01L 27/3276; H01L 27/3262; H01L 27/3265; H01L 51/5246
  See application file for complete search history.

(56) References Cited

U.S. PATENT DOCUMENTS

| | | | |
|---|---|---|---|
| 7,538,488 B2 | 5/2009 | Kwak | |
| 7,791,266 B2 | 9/2010 | Kim | |
| 8,704,237 B2 | 4/2014 | Lee et al. | |
| 9,543,371 B2 | 1/2017 | Kim et al. | |
| 10,224,386 B2 | 3/2019 | Rieutort-Louis et al. | |

(Continued)

FOREIGN PATENT DOCUMENTS

| | | |
|---|---|---|
| KR | 10-0669710 | 1/2007 |
| KR | 10-0721949 | 5/2007 |

(Continued)

*Primary Examiner* — Phuc T Dang
(74) *Attorney, Agent, or Firm* — F. Chau & Associates, LLC

(57) ABSTRACT

A display apparatus includes a first substrate including a display area and a peripheral area on a side of the display area, a second substrate facing the first substrate, a fan-out portion arranged in the peripheral area and including a plurality of wires, a power supply line arranged over the fan-out portion and in the peripheral area, an insulating layer arranged between the plurality of wires and the power supply line, and a sealing portion arranged in the peripheral area. The sealing portion surrounds a periphery of the display area and attaches the first substrate and the second substrate to each other. The peripheral area includes an overlapping area in which the fan-out portion, the power supply line, and the sealing portion overlap one another. The power supply line arranged in the overlapping area includes a first conductive layer and a second conductive layer arranged on the first conductive layer.

20 Claims, 20 Drawing Sheets

(56) References Cited

U.S. PATENT DOCUMENTS

| | | |
|---|---|---|
| 2010/0025690 A1 | 2/2010 | Kim et al. |
| 2012/0098811 A1* | 4/2012 | Park .................. G02F 1/136286 345/211 |
| 2017/0141349 A1* | 5/2017 | Kwak ..................... H01L 51/56 |
| 2019/0012031 A1* | 1/2019 | Kim .................... H01L 51/5203 |
| 2020/0091268 A1 | 3/2020 | Cho et al. |

FOREIGN PATENT DOCUMENTS

| | | |
|---|---|---|
| KR | 10-1482196 | 1/2015 |
| KR | 10-2015-0072986 | 6/2015 |
| KR | 10-1875774 | 7/2018 |
| KR | 10-1899878 | 9/2018 |
| KR | 10-2019-0026940 | 3/2019 |
| KR | 10-2020-0032302 | 3/2020 |

* cited by examiner

DISPLAY APPARATUS INCLUDING POWER SUPPLY LINE AND FAN-OUT PORTION

CROSS-REFERENCE TO RELATED APPLICATIONS

This application claims priority under 35 U.S.C. § 119 to Korean Patent Application No. 10-2019-0121743, filed on Oct. 1, 2019 in the Korean Intellectual Property Office, the disclosure of which is incorporated by reference herein in its entirety.

TECHNICAL FIELD

Exemplary embodiments relate to a display apparatus, and more particularly, to a display apparatus having improved reliability by preventing a short circuit from occurring between vertically stacked wires.

DISCUSSION OF THE RELATED ART

Display apparatuses are used for a wide variety of purposes, and have recently become thinner and lighter.

In general, a display apparatus includes a thin film transistor and display elements (for example, an organic light-emitting diode) arranged on a substrate, in which the display elements operate by emitting light. Such a display apparatus may be used as a display of a small product such as, for example, a cellular phone, or as a display of a large product such as, for example, a television.

Such a display apparatus includes insulating layers and conductive layers alternating on the substrate, and various devices, circuits, and wires formed by patterning the conductive layers with a photoresist.

SUMMARY

In a display apparatus of the related art, a short circuit between vertically stacked wires may occur because a thickness of an insulating layer decreases as a lower insulating layer is also etched during a process of patterning a conductive layer.

Exemplary embodiments provide a display apparatus having improved reliability by preventing a short circuit from occurring between vertically stacked wires. However, the present disclosure is not limited thereto.

In an exemplary embodiment, a display apparatus includes a first substrate including a display area and a peripheral area arranged on a side of the display area, a second substrate facing the first substrate, a fan-out portion arranged in the peripheral area and including a plurality of wires, a power supply line arranged over the fan-out portion and in the peripheral area, an insulating layer arranged between the plurality of wires and the power supply line, and a sealing portion arranged in the peripheral area. The sealing portion surrounds a periphery of the display area and attaches the first substrate and the second substrate to each other. The peripheral area includes an overlapping area in which the fan-out portion, the power supply line, and the sealing portion overlap one another, and the power supply line arranged in the overlapping area includes a first conductive layer and a second conductive layer arranged on the first conductive layer.

In an exemplary embodiment, the second conductive layer clads an upper surface and a side surface of the first conductive layer.

In an exemplary embodiment, the second conductive layer is wider than the first conductive layer.

In an exemplary embodiment, the insulating layer includes a first step surface extending from the side surface of the first conductive layer towards the first substrate.

In an exemplary embodiment, the insulating layer further includes a second step surface extending from a side surface of the second conductive layer towards the first substrate.

In an exemplary embodiment, the sealing portion directly contacts the second step surface.

In an exemplary embodiment, a first portion of the insulating layer where the first conductive layer is arranged is thicker than a second portion of the insulating layer where the first conductive layer is not arranged.

In an exemplary embodiment, a third portion of the insulating layer directly contacting a lower surface of the second conductive layer is thinner than the first portion of the insulating layer where the first conductive layer is arranged.

In an exemplary embodiment, a side surface of the second conductive layer and a side surface of the first conductive layer are a same etched surface.

In an exemplary embodiment, a width of the second conductive layer is substantially the same as a width of the first conductive layer.

In an exemplary embodiment, the insulating layer includes a step surface extending from the side surface of the second conductive layer and the side surface of the first conductive layer towards the first substrate.

In an exemplary embodiment, a first portion of the insulating layer where the first conductive layer is arranged is thicker than a second portion of the insulating layer where the first conductive layer is not arranged.

In an exemplary embodiment, the display apparatus further includes a first inorganic insulating layer and a second inorganic insulating layer arranged in the peripheral area. The second inorganic insulating layer is arranged on the first inorganic insulating layer, and the insulating layer is arranged on the second inorganic insulating layer. The plurality of wires includes a plurality of first wires arranged between the first inorganic insulating layer and the second inorganic insulating layer, and a plurality of second wires arranged between the second inorganic insulating layer and the insulating layer. The plurality of first wires and the plurality of second wires alternate with each other.

In an exemplary embodiment, the display apparatus further includes a pixel circuit including a thin film transistor and a storage capacitor arranged in the display area, and a display element electrically connected to the pixel circuit. The thin film transistor includes a semiconductor layer, a gate electrode at least partially overlapping the semiconductor layer, and an electrode layer arranged below the gate electrode and connected to the semiconductor layer. The storage capacitor includes a lower electrode corresponding to at least a portion of the gate electrode and an upper electrode arranged over the lower electrode.

In an exemplary embodiment, the plurality of first wires includes a same first material as the gate electrode, and the plurality of second wires includes a same second material as the upper electrode.

In an exemplary embodiment, the display element includes a pixel electrode, an opposite electrode arranged above the pixel electrode, and an intermediate layer arranged between the pixel electrode and the opposite electrode. The display apparatus further includes a contact metal layer arranged between the electrode layer and the pixel electrode and electrically connecting the electrode layer and the pixel electrode to each other.

In an exemplary embodiment, the first conductive layer includes a same material as the electrode layer.

In an exemplary embodiment, the second conductive layer includes a same material as the contact metal layer.

In an exemplary embodiment, the power supply line supplies common power to the opposite electrode or supplies driving power to the thin film transistor.

In an exemplary embodiment, at least a portion of the sealing portion is arranged on the second conductive layer and directly contacts the second conductive layer.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1:
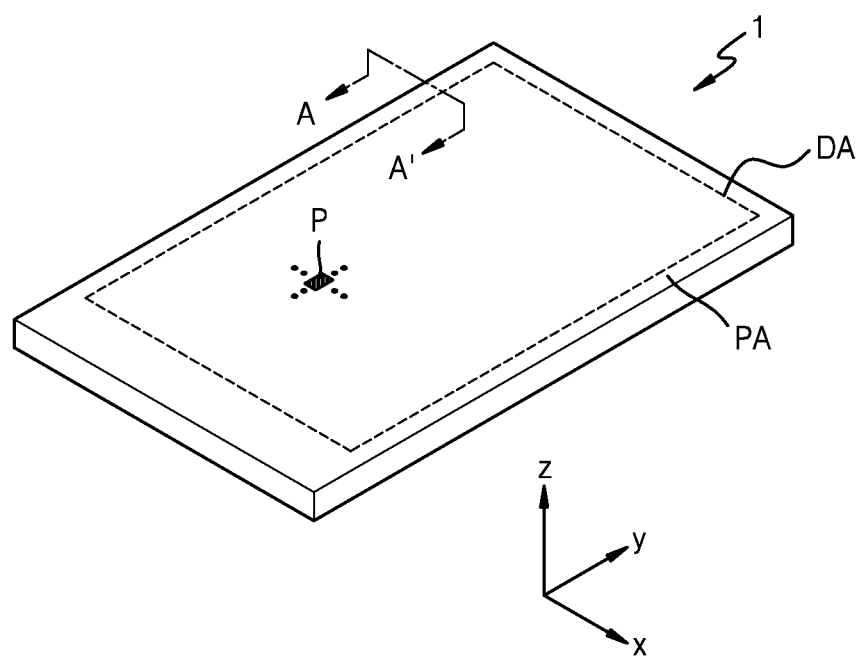
FIG. 1 is a schematic perspective view of a display apparatus according to an exemplary embodiment.

Exemplary embodiments of the present disclosure will be described more fully hereinafter with reference to the accompanying drawings. Like reference numerals may refer to like elements throughout the accompanying drawings.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components, but do not preclude the presence or addition of one or more other features or components.

It will be further understood that, when a layer, region, or component is referred to as being "on" another layer, region, or component, it can be directly or indirectly on the other layer, region, or component. That is, for example, intervening layers, regions, or components may or may not be present.

When an exemplary embodiment may be implemented differently, a certain process order may be performed differently from the described order. For example, two consecutively described processes may be performed substantially at the same time or performed in an order opposite to the described order.

It will be further understood that, when layers, regions, or components are referred to as being "connected" to each other, they may be "directly connected" to each other and/or "indirectly connected" to each other with intervening layers, regions, or components therebetween.

The x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. For example, when two or more elements or values are substantially the same as or about equal to each other but are not identical to each other, it is to be understood that the two or more elements or values are approximately the same as or equal to each other within a measurement error as would be understood by a person having ordinary skill in the art. Other uses of the term "substantially" should be construed in a like fashion.

The terms "about" or "approximately" as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a schematic perspective view of a display apparatus 1 according to an exemplary embodiment.

Referring to FIG. 1, the display apparatus 1 includes a display area DA in which an image is displayed and a peripheral area PA in which an image is not displayed. The display apparatus 1 may provide an image by using light emitted from the display area DA.

Although FIG. 1 shows a display apparatus 1 in which the display area DA has a quadrilateral shape, the disclosure is not limited thereto. For example, a shape of the display area DA may be a circle, an oval, or a polygon such as a triangle or a pentagon. Further, although FIG. 1 shows that the display apparatus 1 is a flat panel display apparatus in a flat form, the display apparatus 1 may be implemented in various forms such as, for example, flexible, foldable, or rollable display apparatuses.

Figure 2:
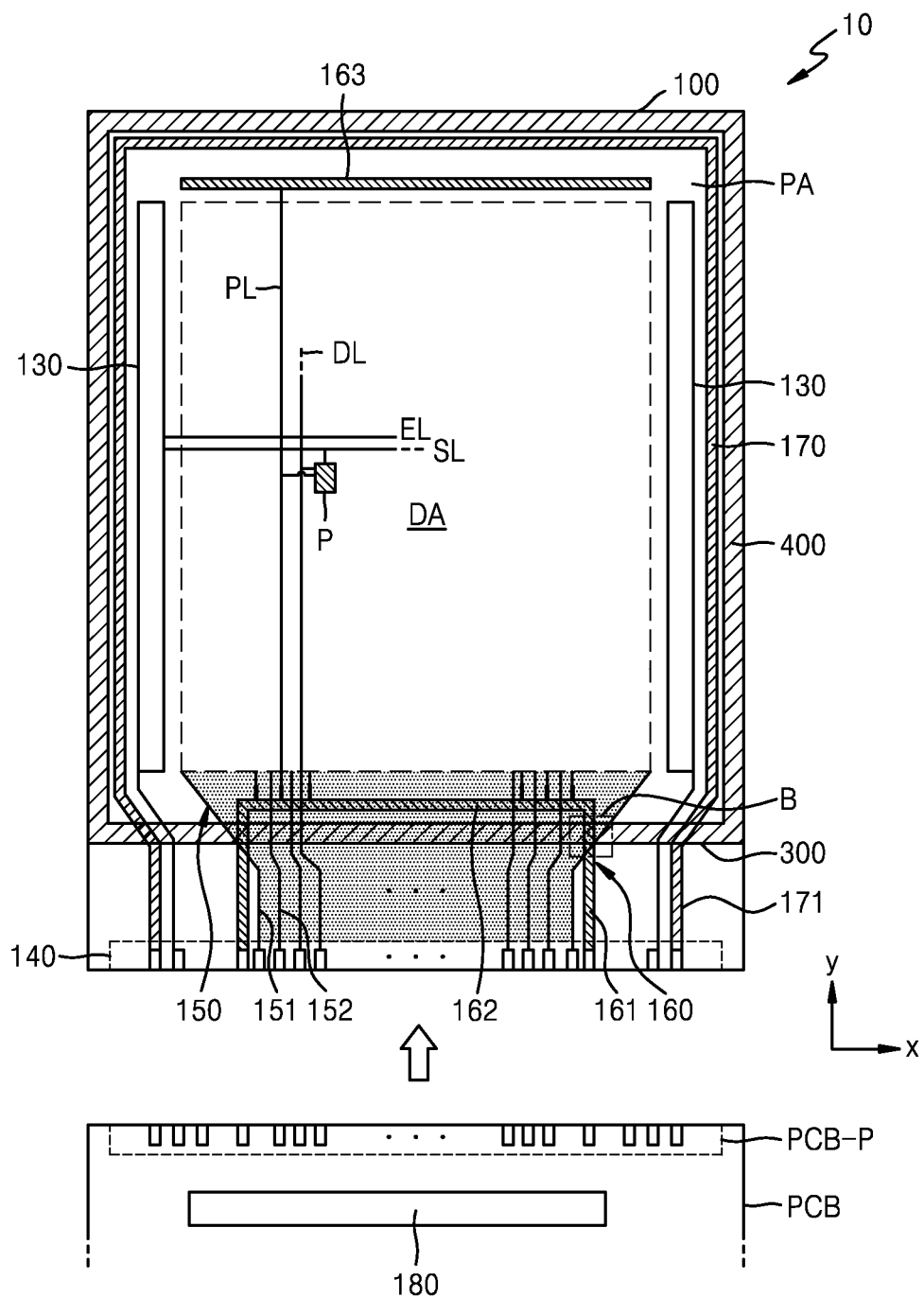
FIG. 2 is a schematic plan view of a display panel according to an exemplary embodiment.

The display apparatus 1 may include a component arranged on one side of a display panel 10 (see FIG. 2). The component may be an electronic element using light or sound. For example, the electronic element may be a sensor, such as an infrared sensor receiving and using light, a camera receiving light to capture an image, a sensor outputting and sensing light or sound to measure a distance or recognize a fingerprint, a small lamp outputting light, or a speaker outputting sound.

Although an organic light-emitting display apparatus is described below as an example of the display apparatus 1 according to an exemplary embodiment, the display apparatus described herein is not limited thereto. For example, in an exemplary embodiment, the display apparatus 1 may be a display apparatus such as an inorganic light-emitting display apparatus (or an inorganic EL display apparatus) or a quantum dot light-emitting display apparatus. For example, an emission layer of a display element included in the display apparatus 1 may include an organic material, may include an inorganic material, may include quantum dots, may include an organic material and quantum dots, or may include an inorganic material and quantum dots.

FIG. 2 is a schematic plan view of the display panel 10 according to an exemplary embodiment.

Referring to FIGS. 1 and 2, the display apparatus 1 may include the display panel 10. A plurality of pixels P may be arranged in the display area DA of a first substrate 100. Each of the plurality of pixels P may include a display element such as an organic light-emitting diode OLED. Each pixel P may emit, for example, red, green, blue, or white light, through the organic light-emitting diode OLED.

A second substrate 300 may be arranged above the first substrate 100. The second substrate 300 may face the first substrate 100 with components on the first substrate 100 arranged therebetween.

The second substrate 300 may be attached to the first substrate 100 through a sealing portion 400 in the peripheral area PA. The sealing portion 400 may surround a periphery of the display area DA, and may seal the display area DA from the outside and prevent a display element such as the organic light-emitting diode OLED from being exposed to external air and moisture. The sealing portion 400 may be, for example, a frit.

In FIG. 2, on the left side, the right side, and the upper side of the display area DA, the sealing portion 400 is spaced apart from a second power supply line 170. However, the disclosure is not limited thereto. For example, in an exemplary embodiment, on the left side, the right side, and the upper side of the display area DA, the sealing portion 400 may partially overlap the second power supply line 170.

In an exemplary embodiment, the display area DA may be covered by a thin film encapsulation layer instead of the second substrate 300, and may be protected from external air or moisture by the thin film encapsulation layer. The thin film encapsulation layer may be integrally provided to correspond to the entire surface of the display area DA and may be partially arranged in the peripheral area PA as well. The thin film encapsulation layer may cover some or all of a scan driving circuit 130, a data driving circuit 180, a first power supply line 160, and the second power supply line 170.

The organic light-emitting diode OLED is vulnerable to external factors such as moisture and oxygen, and thus, the reliability of the display panel 10 may be improved by sealing the organic light-emitting diode OLED. When the thin film encapsulation layer is used for protection instead of the second substrate 300, the display panel 10 may have a decreased thickness, and flexibility thereof may also be improved.

Each pixel P may be electrically connected to peripheral circuits arranged in the peripheral area PA. The scan driving circuit 130, a terminal 140, the first power supply line 160, the second power supply line 170, and the data driving circuit 180 may be arranged in the peripheral area PA.

The scan driving circuit 130 may provide a scan signal to each pixel P via a scan line SL. An emission driving circuit for providing an emission control signal to each pixel P via an emission control line EL may be further arranged on one side of the scan driving circuit 130. Scan driving circuits 130 may be arranged on both sides of the display area DA. Some of the pixels P arranged in the display area DA may be electrically connected to the scan driving circuit 130 located on the left, and other pixels P may be connected to the scan driving circuit 130 located on the right. In an exemplary embodiment, the scan driving circuit 130 may be provided on only one side of the display area DA.

The terminal 140 may be arranged on one side of the first substrate 100. In an exemplary embodiment, the terminal 140 is not covered by an insulating layer, but rather, may be exposed and electrically connected to a printed circuit board PCB. A terminal PCB-P of the printed circuit board PCB may be electrically connected to the terminal 140 of the display panel 10. The printed circuit board PCB is configured to transmit a signal or power of a controller to the display panel 10.

Control signals generated by the controller may be transmitted to the scan driving circuits 130, respectively, through the printed circuit board PCB. The controller may provide first and second power voltages ELVDD and ELVSS to the first and second power supply lines 160 and 170, respectively, via first and second connection wires 161 and 171. The first power voltage ELVDD may be provided to each pixel P via a driving voltage line PL connected to the first power supply line 160, and the second power voltage ELVSS may be provided to an opposite electrode of each pixel P connected to the second power supply line 170.

The first power supply line 160 may include a first sub-wire 162 and a second sub-wire 163 extending substantially parallel to each other in a direction x with the display area DA arranged therebetween. The second power supply line 170 may partially surround the display area DA in a loop having one side open. For example, in an exemplary embodiment, the second power supply line 170 may be arranged on the left side, the right side, and the upper side of the display area DA, and is not arranged on the bottom side of the display area DA.

The data driving circuit 180 is electrically connected to a data line DL. A data signal of the data driving circuit 180 may be provided to each pixel P by a fan-out portion 150 connecting the terminal 140 and the data line DL to each other. The fan-out portion 150 may include a plurality of wires, for example, first and second wires 151 and 152, and one side of each of the plurality of wires, for example, the first and second wires 151 and 152, may be connected to the terminal 140, and the other side may be connected to the data line DL. The fan-out portion 150 may have a fan-out structure gradually spreading out from the terminal 140 towards the display area DA. Portions of the first power supply line 160 and the sealing portion 400 may be arranged over the fan-out portion 150 to overlap the fan-out portion 150.

Although FIG. 2 shows the data driving circuit 180 arranged on the printed circuit board PCB, the present disclosure is not limited thereto. For example, in an exemplary embodiment, the data driving circuit 180 may be arranged on the first substrate 100. For example, the data driving circuit 180 may be arranged between the terminal 140 and the first power supply line 160.

Figure 3:
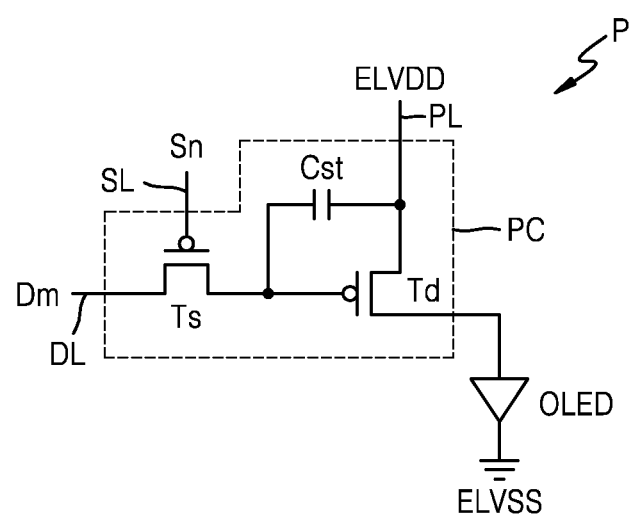
FIGS. 3 and 4 are equivalent circuit diagrams of a pixel that may be included in a display apparatus according to exemplary embodiments.
Figure 4:
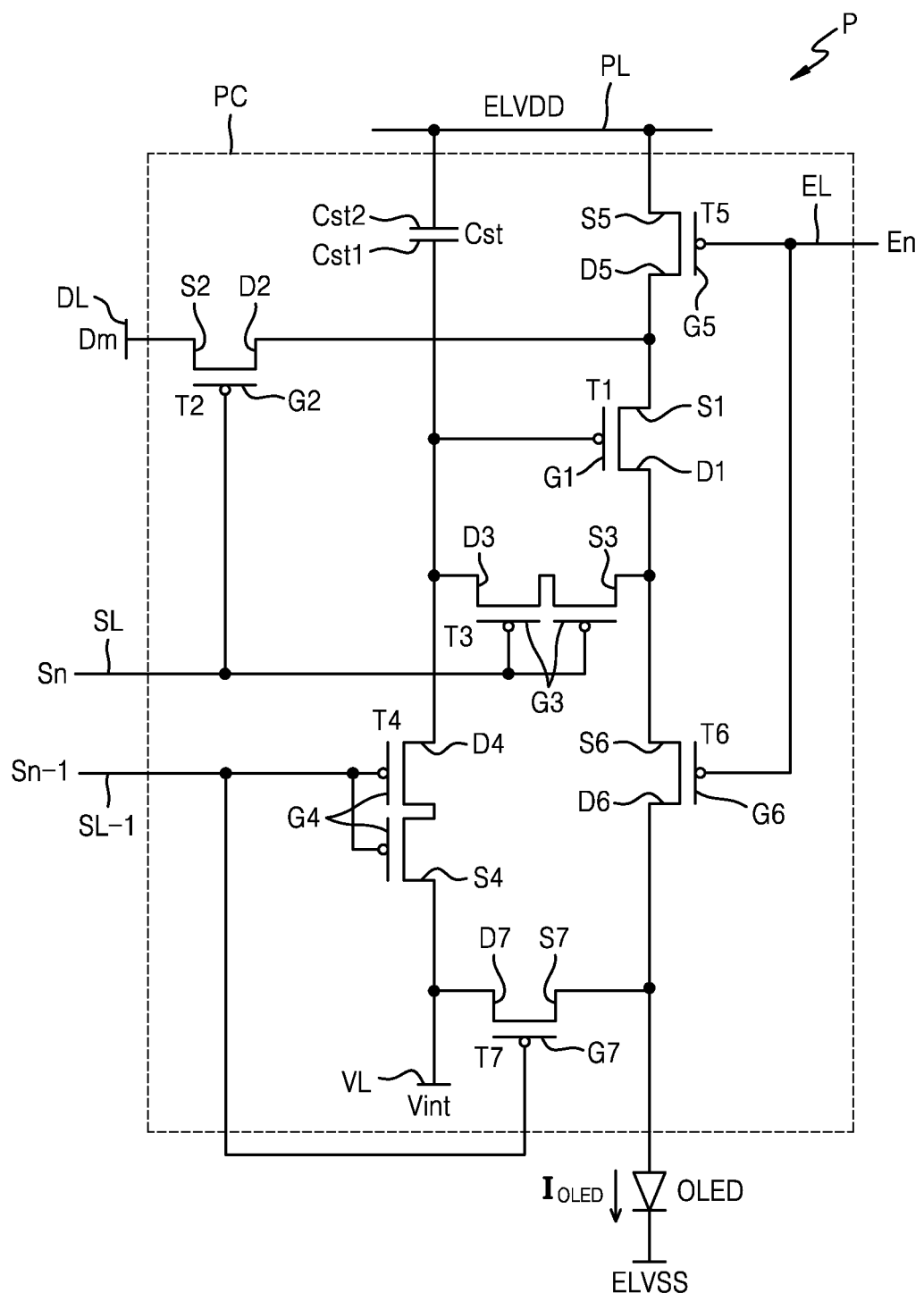

FIGS. 3 and 4 are equivalent circuit diagrams of the pixel P that may be included in a display apparatus according to exemplary embodiments.

Referring to FIG. 3, each pixel P includes a pixel circuit PC connected to the scan line SL and the data line DL, and an organic light-emitting diode OLED connected to the pixel circuit PC.

The pixel circuit PC may include a driving thin film transistor Td, a switching thin film transistor Ts, and a storage capacitor Cst. The switching thin film transistor Ts may be connected to the scan line SL and the data line DL and may be configured to transmit a data signal Dm input via the data line DL to the driving thin film transistor Td according to a scan signal Sn input via the scan line SL.

The storage capacitor Cst may be connected to the switching thin film transistor Ts and the driving voltage line PL, and may store a voltage corresponding to a difference between a voltage received from the switching thin film transistor Ts and the first power voltage ELVDD (or a driving voltage) supplied to the driving voltage line PL.

The driving thin film transistor Td may be connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having a certain brightness according to the driving current.

Although a case in which the pixel circuit PC includes two thin film transistors and one storage capacitor has been described with reference to FIG. 3, the disclosure is not limited thereto. For example, in an exemplary embodiment, as shown in FIG. 4, the pixel circuit PC may include seven thin film transistors and one storage capacitor. In an exemplary embodiment, the pixel circuit PC may include two or more storage capacitors.

Referring to FIG. 4, the pixel P includes the pixel circuit PC and the organic light-emitting diode OLED connected to the pixel circuit PC. The pixel circuit PC may include a plurality of thin film transistors and the storage capacitor Cst. The plurality of thin film transistors and the storage capacitor Cst may be connected to signal lines, for example, the scan line SL, a previous scan line SL-1, the emission control line EL, and the data line DL, and/or an initialization voltage line VL and the driving voltage line PL.

Although FIG. 4 shows each pixel P connected to signal lines, for example, the scan line SL, the previous scan line SL-1, the emission control line EL, and the data line DL, and/or the initialization voltage line VL and the driving voltage line PL, the disclosure is not limited thereto. For example, in an exemplary embodiment, at least one of signal lines, for example, the scan line SL, the previous scan line SL-1, the emission control line EL, and the data line DL, and/or the initialization voltage line VL and the driving voltage line PL, may be shared among neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL for transferring the scan signal Sn, the previous scan line SL-1 transferring a previous scan signal Sn-1 to the first initialization thin film transistor T4 and the second initialization thin film transistor T7, the emission control line EL transferring an emission control signal En to the operation control thin film transistor T5 and the emission control thin film transistor T6, and the data line DL crossing the scan line SL and transferring the data signal Dm.

The driving voltage line PL is configured to transfer the driving voltage ELVDD to the driving thin film transistor T1, and the initialization voltage line VL is configured to transfer an initialization voltage Vint for initializing the driving thin film transistor T1 and a pixel electrode.

A driving gate electrode G1 of the driving thin film transistor T1 is connected to a first storage capacitive plate Cst1 of the storage capacitor Cst, a driving source electrode S1 of the driving thin film transistor T1 is connected to the driving voltage line PL via the operation control thin film transistor T5, and a driving drain electrode D1 of the driving thin film transistor T1 is electrically connected to a pixel electrode of the organic light-emitting diode OLED via the emission control thin film transistor T6. The driving thin film transistor T1 receives the data signal Dm according to a switching operation of the switching thin film transistor T2, and thus supplies a driving current $I_{OLED}$ to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and is also connected to the driving voltage line PL via the operation control thin film transistor T5. The switching thin film transistor T2 is turned on according to the scan signal Sn received via the scan line SL, and thus performs a switching operation for transmitting the data signal Dm transferred via the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and is also connected to the pixel electrode of the organic light-emitting diode OLED via the emission control thin film transistor T6, and a compensation drain electrode D3 of the compensation thin film transistor T3 is connected to the first storage capacitive plate Cst1 of the storage capacitor Cst, a first initialization drain electrode D4 of the first initialization thin film transistor T4, and the driving gate electrode G1 of the driving thin film transistor T1. The compensation thin film transistor T3 is turned on according to the scan signal Sn received via the scan line SL, and thus diode-connects the driving thin film transistor T1 by electrically connecting the driving gate electrode G1 and the driving drain electrode D1 of the driving thin film transistor T1 to each other.

A first initialization gate electrode G4 of the first initialization thin film transistor T4 is connected to the previous scan line SL-1, a first initialization source electrode S4 of the first initialization thin film transistor T4 is connected to a second initialization drain electrode D7 of the second initialization thin film transistor T7 and the initialization voltage line VL, and the first initialization drain electrode D4 of the first initialization thin film transistor T4 is connected to the first storage capacitive plate Cst1 of the storage capacitor Cst, the compensation drain electrode D3 of the compensation thin film transistor T3, and the driving gate electrode G1 of the driving thin film transistor T1. The first initialization thin film transistor T4 is turned on according to the previous scan signal Sn-1 received via the previous scan line SL-1, and thus performs an initialization operation for initializing a voltage of the driving gate electrode G1 of the driving thin film transistor T1 by transmitting the initialization voltage Vint to the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to a second initialization source electrode S7 of the second initialization thin film transistor T7 and the pixel electrode of the organic light-emitting diode OLED.

As the operation control thin film transistor T5 and the emission control thin film transistor T6 are simultaneously turned on according to the emission control signal En received via the emission control line EL, the driving voltage ELVDD is transmitted to the organic light-emitting diode OLED, and thus, the driving current $I_{OLED}$ flows through the organic light-emitting diode OLED.

A second initialization gate electrode G7 of the second initialization thin film transistor T7 is connected to the previous scan line SL-1, the second initialization source electrode S7 of the second initialization thin film transistor T7 is connected to the emission control drain electrode D6 of the emission control thin film transistor T6 and the pixel electrode of the organic light-emitting diode OLED, and the second initialization drain electrode D7 of the second initialization thin film transistor T7 is connected to the first initialization source electrode S4 of the first initialization thin film transistor T4 and the initialization voltage line VL. The second initialization thin film transistor T7 is turned on according to the previous scan signal Sn-1 received via the previous scan line SL-1, and thus initializes the pixel electrode of the organic light-emitting device OLED.

Although FIG. 4 shows a case in which the first initialization thin film transistor T4 and the second initialization thin film transistor T7 are connected to the previous scan line SL-1, the disclosure is not limited thereto. For example, in an exemplary embodiment, the first initialization thin film transistor T4 may be connected to the previous scan line SL-1 and be driven according to the previous scan signal Sn-1, and the second initialization thin film transistor T7 may be connected to a separate signal line (for example, a subsequent scan line) and be driven according to a signal transmitted to the signal line.

A second storage capacitive plate Cst2 of the storage capacitor Cst is connected to the driving voltage line PL, and an opposite electrode of the organic light-emitting diode OLED is connected to the second power voltage ELVSS (e.g., a common voltage). Accordingly, the organic light-emitting diode OLED may receive the driving current $I_{OLED}$ from the driving thin film transistor T1, and thus may emit light, thereby displaying an image.

Although FIG. 4 shows the compensation thin film transistor T3 and the first initialization thin film transistor T4 each having a dual gate electrode, the compensation thin film transistor T3 and the first initialization thin film transistor T4 are not limited thereto. For example, in an exemplary embodiment, the compensation thin film transistor T3 and the first initialization thin film transistor T4 may each have one gate electrode.

Figure 5:
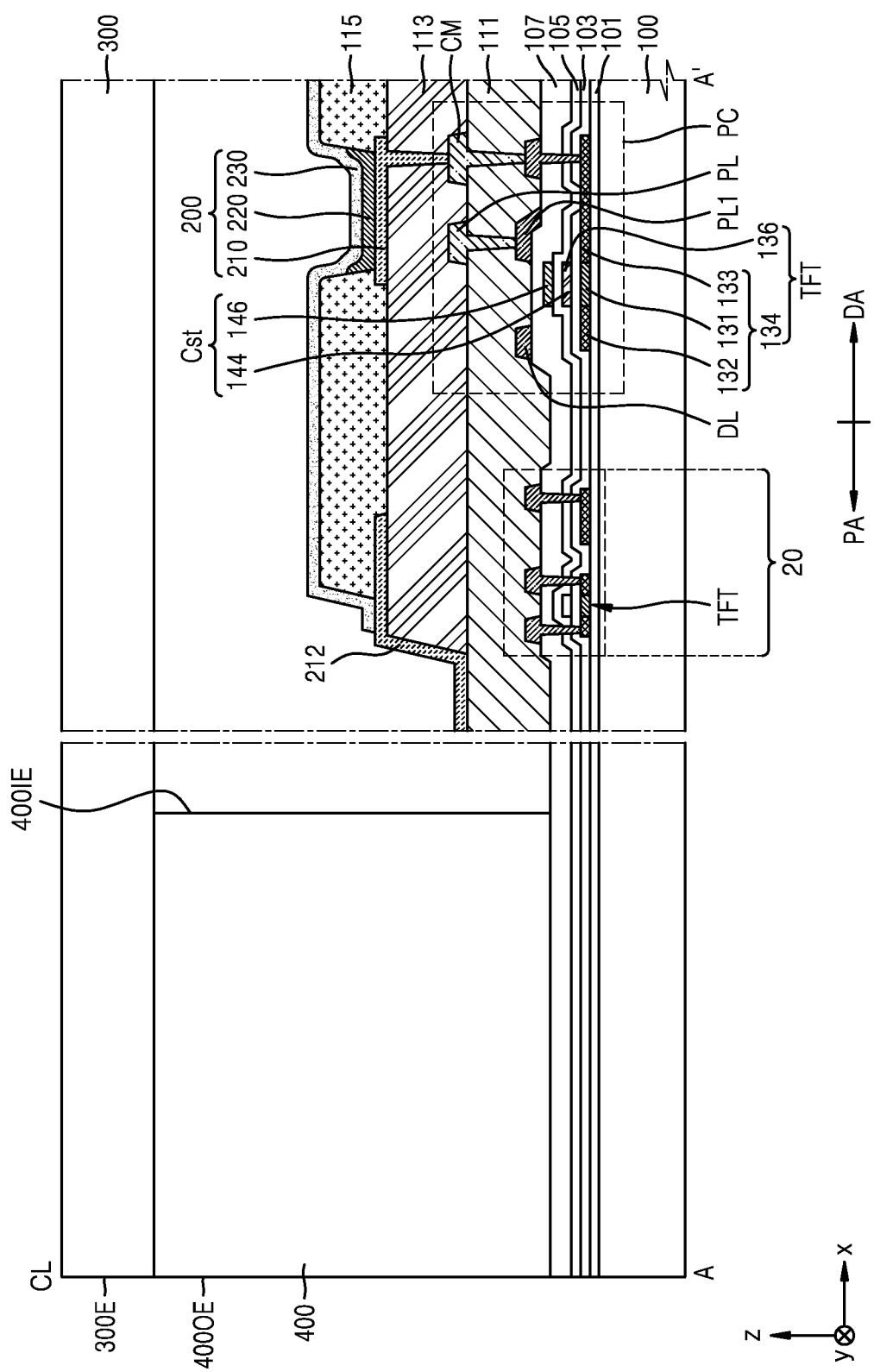
FIG. 5 is a schematic cross-sectional view of a display apparatus according to an exemplary embodiment.

FIG. 5 is a schematic cross-sectional view of a display apparatus according to an exemplary embodiment. For example, FIG. 5 may be a cross-sectional view taken along line A-A' of FIG. 1.

Referring to FIG. 5, the display apparatus includes the display area DA and the peripheral area PA. The first substrate 100 and the second substrate 300 may be attached to each other by the sealing portion 400 surrounding the display area DA and located in the peripheral area PA.

The first substrate 100 may include various materials such as, for example, glass, metal, or plastic such as polyethylene terephthalate (PET), polyethylene naphthalate (PEN), polyimide, etc. The second substrate 300 may include a transparent material. For example, the second substrate 300 may include various materials such as, for example, glass or plastic such as PET, PEN, polyimide, etc. The first substrate 100 and the second substrate 300 may include the same material as each other or may include different materials from each other.

Referring to the display area DA of FIG. 5, a buffer layer 101 may be arranged on the first substrate 100. The buffer layer 101 may block foreign materials or moisture from penetrating through the first substrate 100. For example, the buffer layer 101 may include an inorganic material such as silicon oxide ($SiO_x$), silicon nitride ($SiN_x$) and/or silicon oxynitride (SiON), and may have a single-layer or multi-layer structure.

A thin film transistor TFT and the storage capacitor Cst provided at a location corresponding to the display area DA, and a display element such as an organic light-emitting diode 200 electrically connected thereto, may be located over the first substrate 100. The thin film transistor TFT of FIG. 5 may correspond to, for example, one of the thin film transistors included in the pixel circuit PC described with reference to FIG. 4 (e.g., the driving thin film transistor T1), and the storage capacitor Cst of FIG. 5 may correspond to the storage capacitor Cst described with reference to FIG. 4.

The thin film transistor TFT includes a semiconductor layer 134 and a gate electrode 136. The semiconductor layer 134 may include, for example, polysilicon. The semiconductor layer 134 may include a channel region 131 overlapping the gate electrode 136, and a source region 132 and a drain region 133 arranged on both sides of the channel region 131 and including impurities having a higher concentration than those of the channel region 131. In this regard, the impurities may include N-type impurities or P-type impurities. The source region 132 and the drain region 133 may be understood as a source electrode and a drain electrode of the thin film transistor TFT. The source region 132 and the drain region 133 may be referred to as an electrode layer. Thus, as shown in FIG. 5, the electrode layer may be arranged below the gate electrode 136 and may be connected to the semiconductor layer 134. A contact metal layer CM may be arranged between the electrode layer and a pixel electrode 210, electrically connecting the electrode layer and the pixel electrode 210 to each other.

Although a case in which the semiconductor layer 134 contains polysilicon (for example, low-temperature polycrystalline silicon (LTPS)) has been described, the disclosure is not limited thereto. For example, in an exemplary embodiment, the semiconductor layer 134 may include amorphous silicon or may include an organic semiconductor material. In an exemplary embodiment, the semiconductor layer 134 may include an oxide semiconductor.

In an exemplary embodiment, the pixel circuit PC may include the driving thin film transistor Td and the switching thin film transistor Ts described above with reference to FIG. 3, and a semiconductor layer of the driving thin film transistor Td and a semiconductor layer of the switching thin film transistor Ts may include different materials from each other. For example, one of the semiconductor layer of the driving thin film transistor Td and the semiconductor layer of the switching thin film transistor Ts may include an oxide semiconductor, and the other may include polysilicon.

A gate insulating layer 103 may be arranged between the semiconductor layer 134 and the gate electrode 136. The gate insulating layer 103 may be an inorganic insulating layer such as, for example, silicon oxynitride (SiON), silicon oxide ($SiO_x$) and/or silicon nitride ($SiN_x$), and the inorganic insulating layer may have a single-layer or multilayer structure.

The storage capacitor Cst includes a lower electrode 144 and an upper electrode 146 overlapping each other. A first interlayer insulating layer 105 may be arranged between the lower electrode 144 and the upper electrode 146.

The first interlayer insulating layer 105, which is a layer having a certain dielectric constant, may be an inorganic insulating layer such as, for example, silicon oxynitride (SiON), silicon oxide ($SiO_x$) and/or silicon nitride ($SiN_x$), and may have a single-layer or multilayer structure. Although FIG. 5 shows a case in which the storage capacitor Cst overlaps the thin film transistor TFT and the lower electrode 144 is the gate electrode 136 of the thin film transistor TFT, the disclosure is not limited thereto. For example, in an exemplary embodiment, the storage capacitor Cst does not overlap the thin film transistor TFT, and the lower electrode 144 may be an independent component separate from the gate electrode 136 of the thin film transistor TFT.

The storage capacitor Cst may be covered by a second interlayer insulating layer 107. The second interlayer insulating layer 107 may be an inorganic insulating layer such as, for example, silicon oxynitride (SiON), silicon oxide ($SiO_x$) and/or silicon nitride ($SiN_x$), and may have a single-layer or multilayer structure.

The driving voltage line PL may be arranged on a first organic insulating layer 111. The driving voltage line PL may include, for example, aluminum (Al), copper (Cu), titanium (Ti), etc., and may have a multilayer or single-layer structure. In an exemplary embodiment, the driving voltage line PL may have a multilayer structure of Ti/Al/Ti.

In an exemplary embodiment according to FIG. 5, a lower driving voltage line PL1 is arranged under the first organic insulating layer 111. The lower driving voltage line PL1 may be electrically connected to the driving voltage line PL via a contact hole penetrating the first organic insulating layer 111, and thus may prevent a voltage drop of the driving voltage ELVDD provided via the driving voltage line PL.

The lower driving voltage line PL1 may include the same material as the data line DL. For example, the lower driving voltage line PL1 and the data line DL may include aluminum (Al), copper (Cu), titanium (Ti), etc., and may have a multilayer or single-layer structure. In an exemplary embodiment, the lower driving voltage line PL1 and the data line DL may have a multilayer structure of Ti/Al/Ti or TiN/Al/Ti.

The first organic insulating layer 111 includes an organic insulating material. The organic insulating material may include, for example, an imide-based polymer, a general commercial polymer such as poly(methyl methacrylate) (PMMA) or polystyrene (PS), a polymer derivative having a phenolic group, an acrylic polymer, an aryl ether-based polymer, an amide-based polymer, a fluorine-based polymer, a p-xylene-based polymer, a vinyl alcohol-based polymer, and a blend thereof. In an exemplary embodiment, the first organic insulating layer 111 may include polyimide.

The driving voltage line PL may be covered by a second organic insulating layer 113, and the second organic insulating layer 113 may include, for example, an imide-based polymer, a general commercial polymer such as PMMA or PS, a polymer derivative having a phenolic group, an acrylic polymer, an aryl ether-based polymer, an amide-based polymer, a fluorine-based polymer, a p-xylene-based polymer, a vinyl alcohol-based polymer, and a blend thereof. In an exemplary embodiment, the second organic insulating layer 113 may include polyimide.

The pixel electrode 210 may be arranged on the second organic insulating layer 113. A pixel-defining layer 115 may be arranged on the pixel electrode 210, and the pixel-defining layer 115 may have an opening corresponding to each sub-pixel, that is, an opening exposing at least a central portion of the pixel electrode 210, and thus may define a pixel. Also, the pixel-defining layer 115 may increase a distance between the edge of the pixel electrode 210 and an opposite electrode 230, and thus may prevent the occurrence of an arc, etc. therebetween. The pixel-defining layer 115 may include, for example, an organic material such as polyimide or hexamethyldisiloxane (HMDSO).

An intermediate layer 220 may be arranged on the pixel electrode 210, and may include a low-molecular weight material or a polymer material. When the intermediate layer 220 includes a low-molecular weight material, the intermediate layer 220 may have a structure in which a hole injection layer (HIL), a hole transport layer (HTL), an emission layer (EML), an electron transport layer (ETL), an electron injection layer (EIL), etc. are stacked in a single or complex structure, and may include various organic materials, including, for example, copper phthalocyanine (CuPc), N,N'-Di(naphthalene-1-yl)-N,N'-diphenyl-benzidine (NPB), tris-8-hydroxyquinoline aluminum ($Alq_3$), etc. Such layers may be formed by vacuum deposition.

When the intermediate layer 220 includes a polymer material, the intermediate layer 220 may generally have a structure including an HTL and an EML. In this regard, the HTL may include poly(3,4-ethylenedioxythiophene) (PEDOT), and the EML may include a polymer material such as, for example, a polyphenylene vinylene (PPV)-based material, a polyfluorene-based material, etc. However, a structure of the intermediate layer 220 is not limited to the above description, and the intermediate layer 220 may have various structures. For example, at least one of the layers constituting the intermediate layer 220 may be integrally formed over a plurality of pixel electrodes 210. Alternatively, the intermediate layer 220 may include a layer patterned to correspond to each of a plurality of pixel electrodes 210.

The opposite electrode 230 may be arranged over the display area DA and may cover the display area DA. That is, the opposite electrode 230 may be integrally formed to cover a plurality of pixels.

A filler may be arranged between the opposite electrode 230 and the second substrate 300. Although the filler may include, for example, one or more from among a photocurable epoxy-based material and an acrylate-based material, the disclosure is not limited thereto.

Referring to the peripheral area PA of FIG. 5, a driving circuit 20 is arranged over the first substrate 100. For example, the driving circuit 20 may be the scan driving circuit 130 or an emission driving circuit of FIG. 2.

The driving circuit 20 may include thin film transistors TFT and a wire connected to the thin film transistors TFT. The thin film transistor TFT may be formed during the same process as the thin film transistor TFT of the pixel circuit PC.

The driving circuit 20 includes an insulating layer arranged between elements (for example, a semiconductor layer, a gate electrode, etc.) constituting the thin film transistor TFT. For example, at least one of the buffer layer 101, the gate insulating layer 103, and the first and second interlayer insulating layers 105 and 107 may extend to the peripheral area PA.

The driving circuit 20 may be relatively adjacent to the display area DA compared to the emission driving circuit. Accordingly, in an exemplary embodiment, as shown in FIG. 5, portions of the first and second organic insulating layers 111 and 113 may extend to the peripheral area PA over the driving circuit 20 and cover the driving circuit 20. In an exemplary embodiment, the first and second organic insulating layers 111 and 113 do not cover the driving circuit 20, and only an inorganic insulating layer may be located on the driving circuit 20.

In an exemplary embodiment, the driving circuit 20 may be covered by an inorganic insulating layer. The inorganic insulating layer may prevent a conductive layer including a metal such as, for example, aluminum, that may be damaged due to an etchant during a process of manufacturing a display apparatus, from being exposed to an etching environment. In some cases, the inorganic insulating layer may be arranged over the display area DA as well. The inorganic insulating layer may include an inorganic material such as, for example, silicon oxide ($SiO_x$), silicon nitride ($SiN_x$) or/and silicon oxynitride (SiON), and may have a single-layer or multilayer structure. In an exemplary embodiment, the inorganic insulating layer may have a thickness of about 500 Å or greater. In exemplary embodiments, the inorganic insulating layer may have a thickness of about 1,000 Å or greater, about 1,500 Å or greater, about 2,000 Å or greater, about 2,500 Å or greater, about 3,000 Å or greater, about 3,500 Å or greater, about 4,000 Å or greater, about 4,500 Å or greater, about 5,000 Å or greater, about 5,500 Å or greater, about 6,000 Å or greater, or about 6,500 Å or greater. Alternatively, the inorganic insulating layer may have a thickness of about 7,000 Å to about 10,000 Å.

The second power supply line 170 (see FIG. 2) may be arranged in the peripheral area PA. In an exemplary embodiment, the second power supply line 170 may be spaced apart from the sealing portion 400 as shown in FIG. 2, or a portion of the second power supply line 170 may overlap the sealing portion 400. In an exemplary embodiment, the second power supply line 170 may overlap a portion of the driving circuit 20. The second power supply line 170 may include the same material as the driving voltage line PL and/or the lower driving voltage line PL1.

The sealing portion 400 is arranged in the peripheral area PA to attach the first substrate 100 and the second substrate 300 to each other. The sealing portion 400 may be located on the layers arranged on the first substrate 100, for example, the buffer layer 101, the gate insulating layer 103, the first interlayer insulating layer 105, and the second interlayer insulating layer 107. In this case, all of the layers between the sealing portion 400 and the first substrate 100, for example, the buffer layer 101, the gate insulating layer 103, the first interlayer insulating layer 105, and the second interlayer insulating layer 107, may be inorganic insulating layers, which may improve adhesion between the sealing portion 400 and the first substrate 100. Although FIG. 5 shows the sealing portion 400 located on the layers arranged on the first substrate 100, for example, the buffer layer 101, the gate insulating layer 103, the first interlayer insulating layer 105, and the second interlayer insulating layer 107, in exemplary embodiments, some of the layers between the sealing portion 400 and the first substrate 100, for example, the buffer layer 101, the gate insulating layer 103, the first interlayer insulating layer 105, and the second interlayer insulating layer 107, may be removed, or another layer may be added.

In an exemplary embodiment, an outer wall 4000E of the sealing portion 400 and an edge 300E of the second substrate 300 may be substantially aligned with each other. For example, the outer wall 4000E of the sealing portion 400 and the edge 300E of the second substrate 300 may be coplanar. A reason is that, in an exemplary embodiment, when a panel including the sealing portion 400 is cut during the manufacture of a display apparatus, the first substrate 100, the sealing portion 400, and the second substrate 300 are cut together along a cutting line CL during the manufacturing process. However, the disclosure is not limited to the above manufacturing method. Thus, in an exemplary embodiment, the outer wall 4000E of the sealing portion 400 and the edge 300E of the second substrate 300 may be misaligned with each other.

In a direction that an inner wall 400IE of the sealing portion 400 faces, space between structures on the first substrate 100 and the second substrate 300 may be formed in a vacuum atmosphere. In an exemplary embodiment, organic and inorganic functional layers may be additionally further arranged on the opposite electrode 230 of FIG. 5.

Figure 6:
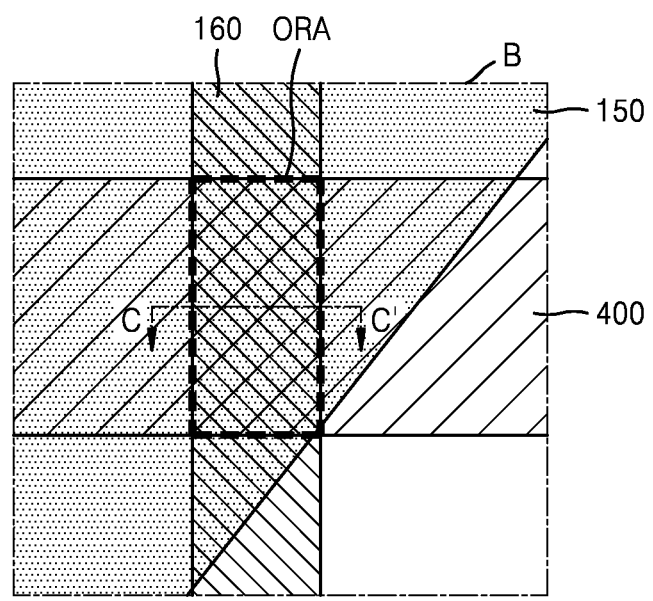
FIG. 6 is a schematic plan view illustrating an enlarged portion of a display apparatus according to an exemplary embodiment.

FIG. 6 is a schematic plan view illustrating an enlarged portion of a display apparatus according to an exemplary embodiment. FIGS. 7A to 7D and FIGS. 8A to 8C are cross-sectional views showing operations of a process of manufacturing a display apparatus according to an exemplary embodiment. FIG. 9 is a schematic cross-sectional view of a portion of a display apparatus according to an exemplary embodiment. More particularly, FIG. 6 is an enlarged view of portion B of FIG. 2, and FIGS. 7A to 7D, FIGS. 8A to 8C, and FIG. 9 correspond to a cross-section taken along line C-C' of FIG. 6.

Figure 12:
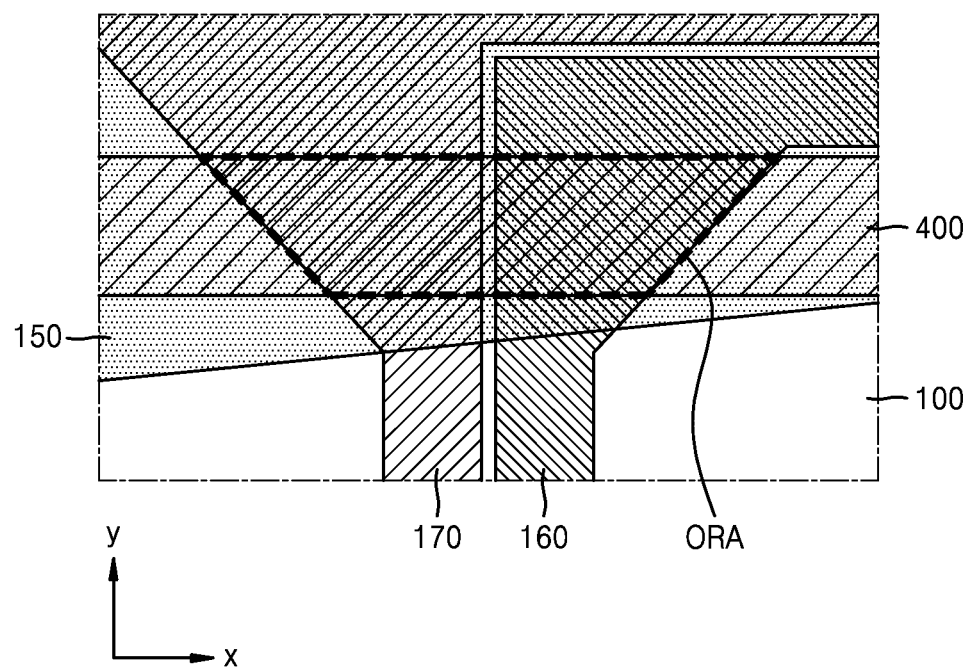
FIG. 12 is an enlarged portion of a display apparatus according to an exemplary embodiment.

Referring to FIG. 6, a display apparatus according to an exemplary embodiment has an overlapping area ORA in which the fan-out portion 150, the first power supply line 160, and the sealing portion 400 overlap one another in a portion of the peripheral area PA. FIG. 6 shows an area in which the fan-out portion 150 and the sealing portion 400 overlap the first power supply line 160. However, the present disclosure is not limited thereto. For example, in an exemplary embodiment, as shown in FIG. 12, an overlapping area ORA in which the fan-out portion 150 and the sealing portion 400 overlap the second power supply line 170 may be included.

Figure 7A:
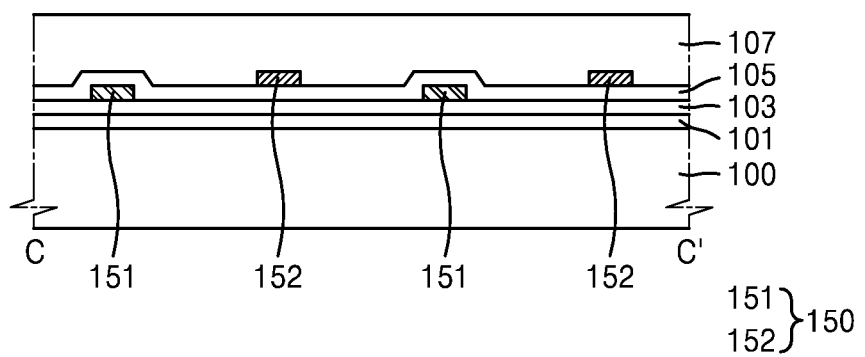
FIGS. 7A to 7D and FIGS. 8A to 8C are cross-sectional views showing operations of a process of manufacturing a display apparatus according to an exemplary embodiment.

Referring to FIG. 7A, the fan-out portion 150 may include a plurality of wires, for example, the first and second wires 151 and 152. The plurality of wires, for example, the first and second wires 151 and 152, may be alternately arranged on different layers from each other. That is, the plurality of wires, for example, the first and second wires 151 and 152, may be alternately arranged with an insulating layer (for example, the first interlayer insulating layer 105) therebetween. For example, in an exemplary embodiment, a plurality of first wires 151 may be arranged on the gate insulating layer 103, and a plurality of second wires 152 may be arranged on the first interlayer insulating layer 105. For example, the plurality of first wires 151 may be arranged directly on the gate insulating layer 103, and the plurality of second wires 152 may be arranged directly on the first interlayer insulating layer 105. The first interlayer insulating layer 105 may directly contact the plurality of first wires 151 and the gate insulating layer 103. The second interlayer insulating layer 107 may be arranged on the fan-out portion 150. In an exemplary embodiment, the plurality of first wires 151 may include the same material as the gate electrode 136 of FIG. 5, and the plurality of second wires 152 may include the same material as the upper electrode 146 of the storage capacitor Cst of FIG. 5.

According to exemplary embodiments, such a structure of the fan-out portion 150 allows for the efficient narrowing of a gap between a plurality of wires, for example, the first and second wires 151 and 152. According to exemplary embodiments, the plurality of wires, for example, the first and second wires 151 and 152, may be prevented from being subject to mutual signal interference or having a short circuit.

A method of forming a power supply line 120 is described below with reference to FIGS. 7B to 8C. The power supply line 120 may be the first power supply line 160 or the second power supply line 170 shown in FIG. 2. Thus, the power supply line 120 may supply common power to the opposite electrode 230 of FIG. 5 or supply driving power to the thin film transistor TFT of FIG. 5. In an exemplary embodiment, the power supply line 120 may have a multilayer structure including a first conductive layer 121 and a second conductive layer 122. The first conductive layer 121 may include the same material as the electrode layer described above with reference to FIG. 5, and the second conductive layer 122 may include the same material as the contact metal layer CM described above with reference to FIG. 5. At least a portion of the sealing portion 400 may be arranged on the second conductive layer 122 and may directly contact the second conductive layer 122.

Figure 7B:
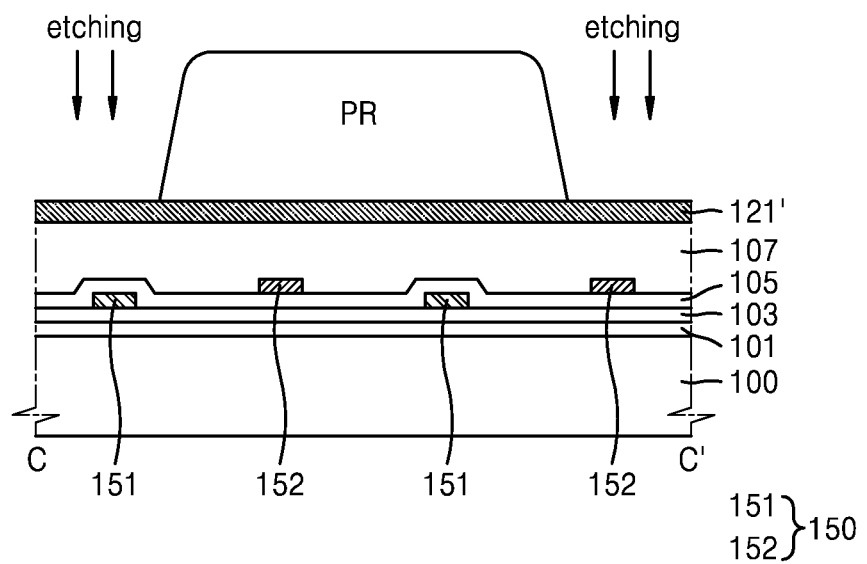

Referring to FIG. 7B, a first conductive material layer 121' is formed on the second interlayer insulating layer 107. The first conductive material layer 121' may include the same material as source/drain electrodes (that is, an electrode layer) of the thin film transistor TFT, and this may be the same material as the data line DL and/or the lower driving voltage line PL1 of FIG. 5.

Next, photoresist PR is formed. Portions of the photoresist PR may each be formed through exposure and development.

The first conductive material layer 121' is patterned using the photoresist PR as a mask. The first conductive material layer 121' may be patterned through an etching process such as, for example, a wet etching process. Although FIG. 7B shows the first conductive material layer 121' in a single-layer structure, the present disclosure is not limited thereto.

For example, in an exemplary embodiment, the first conductive material layer 121' may have a multilayer structure, for example, a multilayer structure such as Ti/Al/Ti. Even when the first conductive material layer 121' has a multilayer structure, sub-layers constituting the first conductive material layer 121' may each be etched by the same etchant.

Figure 7C:
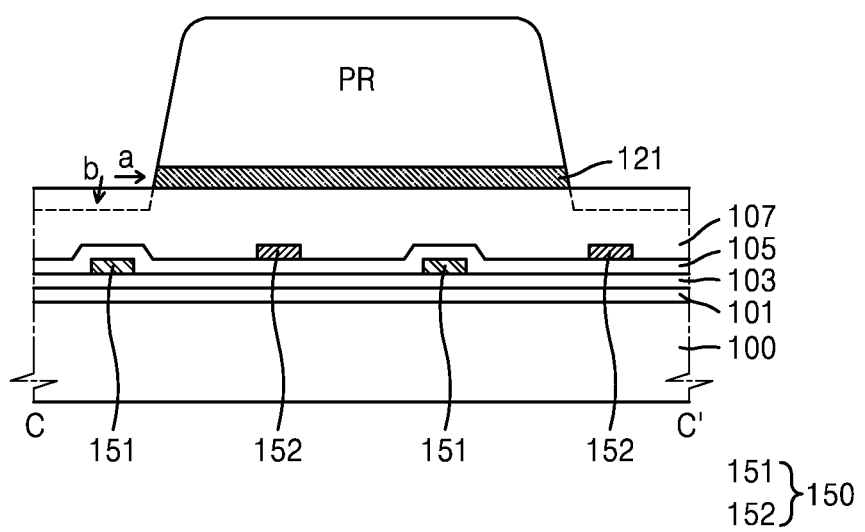

Through the etching process, the first conductive layer 121 may be formed as shown in FIG. 7C.

More particularly, during a process of etching the first conductive material layer 121', as shown in FIG. 7B, the photoresist PR is formed on the first conductive material layer 121', and then, etching, for example, an etching process using an etchant, is performed. The etching process may be performed from an upper portion of the first conductive material layer 121' towards a lower portion of the first conductive material layer 121'. In this regard, after the first conductive material layer 121' is etched, the second interlayer insulating layer 107 located under the first conductive material layer 121' may also be etched. In such a phenomenon, as the first conductive material layer 121' arranged on the second interlayer insulating layer 107 is continuously exposed to an etchant, etching may be performed simultaneously in a direction a and a direction b, and etching in the direction a may influence etching in the direction b. For example, a thickness of a portion of the second interlayer insulating layer 107 exposed to an etchant through etching of the second interlayer insulating layer 107 caused by etching of the first conductive material layer 121' may decrease. However, the portion of the second interlayer insulating layer 107 arranged below the first conductive layer 121 and covered by the photoresist PR and the first conductive layer 121 may maintain a thickness obtained during the initial formation of the second interlayer insulating layer 107.

As a comparative example, a case in which no first conductive material layer 121' is formed over the fan-out portion 150 may be assumed. In such a comparative example, when the power supply line 120 has a single-layer structure including only the second conductive layer 122, the second interlayer insulating layer 107 arranged on the fan-out portion 150 may have an upper surface partially etched by a process of etching the second conductive layer 122. This decreases a thickness of the second interlayer insulating layer 107 arranged on the fan-out portion 150. When a thickness of the second interlayer insulating layer 107 arranged on the fan-out portion 150 decreases, the power supply line 120 may be pressed towards the first substrate 100 by the sealing portion 400, and a short circuit may be created between the power supply line 120 and wires of the fan-out portion 150 due to the second interlayer insulating layer 107 having a decreased thickness.

According to exemplary embodiments, to prevent a short circuit from being created as described above, the power supply line 120 has a multilayer structure including the first conductive layer 121 and the second conductive layer 122. By forming the first conductive layer 121 before forming the second conductive layer 122, the second interlayer insulating layer 107 arranged on the fan-out portion 150 may be prevented from having an upper portion etched together during etching of the first conductive material layer 121' in an area other than the overlapping area ORA. As a result, according to exemplary embodiments, a decrease in thickness of the second interlayer insulating layer 107 arranged on the fan-out portion 150 may be prevented.

Figure 7D:
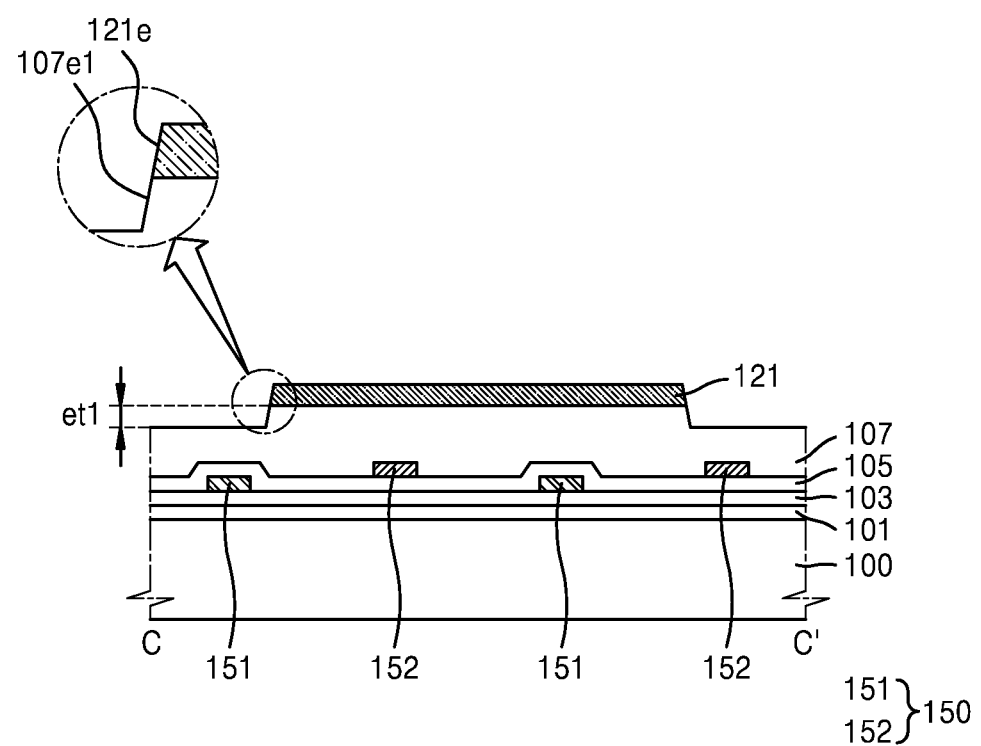

The first conductive layer 121 obtained by patterning may have a shape shown in FIG. 7D. After the etching process, the photoresist PR may be removed. Through the above etching process, a first step surface 107e1 may be formed in the second interlayer insulating layer 107, as shown in FIG. 7D. The first step surface 107e1 of the second interlayer insulating layer 107 may extend from the side surface 121e of the first conductive layer 121 towards the first substrate 100. Due to the first step surface 107e1 of the second interlayer insulating layer 107, a first step et1 having a certain height may be formed in the second interlayer insulating layer 107. For example, a height of the first step et1 of the second interlayer insulating layer 107 may be about 1000 Å to about 2000 Å, but may be changed by an environment for the etching process, an etchant in use, etc. A side surface 121e of the first conductive layer 121 and the first step surface 107e1 of the second interlayer insulating layer 107 formed by the same etching process may be coplanar. For example, as shown in FIG. 7D, in an exemplary embodiment, the side surface 121e of the first conductive layer 121 and the first step surface 107e1 may be substantially aligned with each other.

Next, the above processes are repeated to form the second conductive layer 122.

Figure 8A:
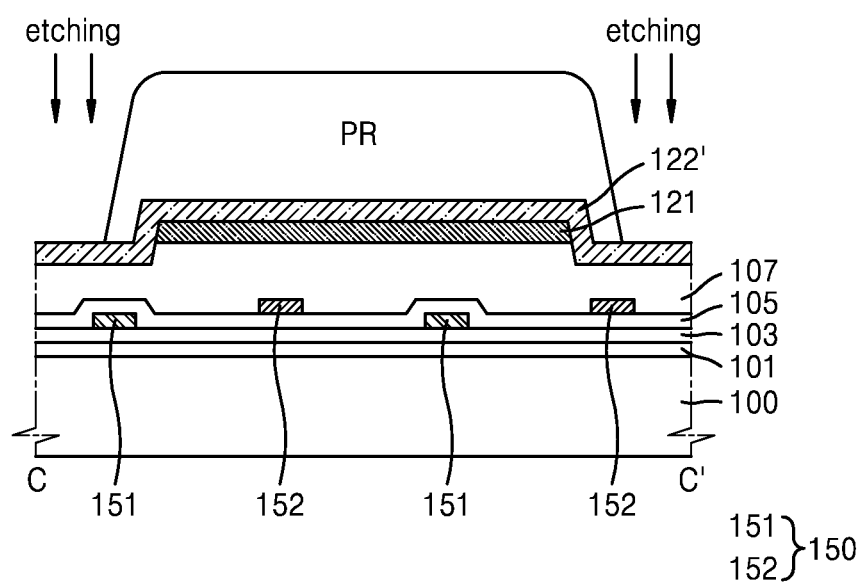
Figure 8B:
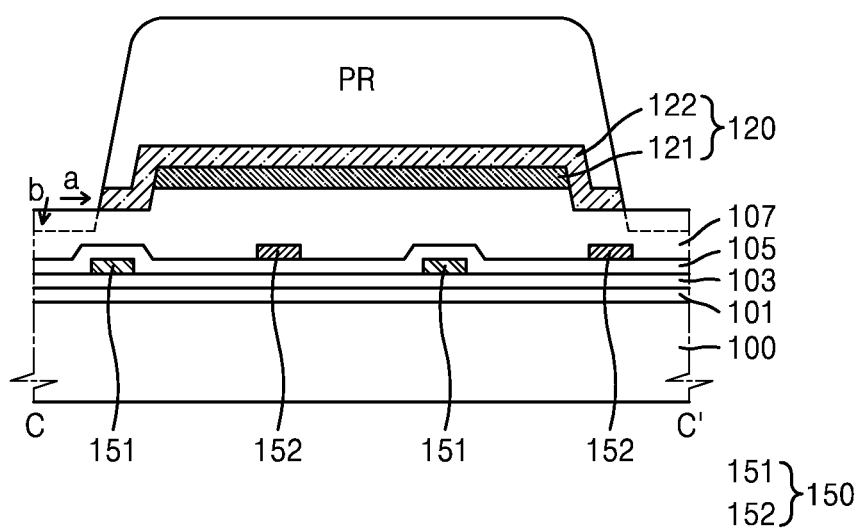
Figure 8C:
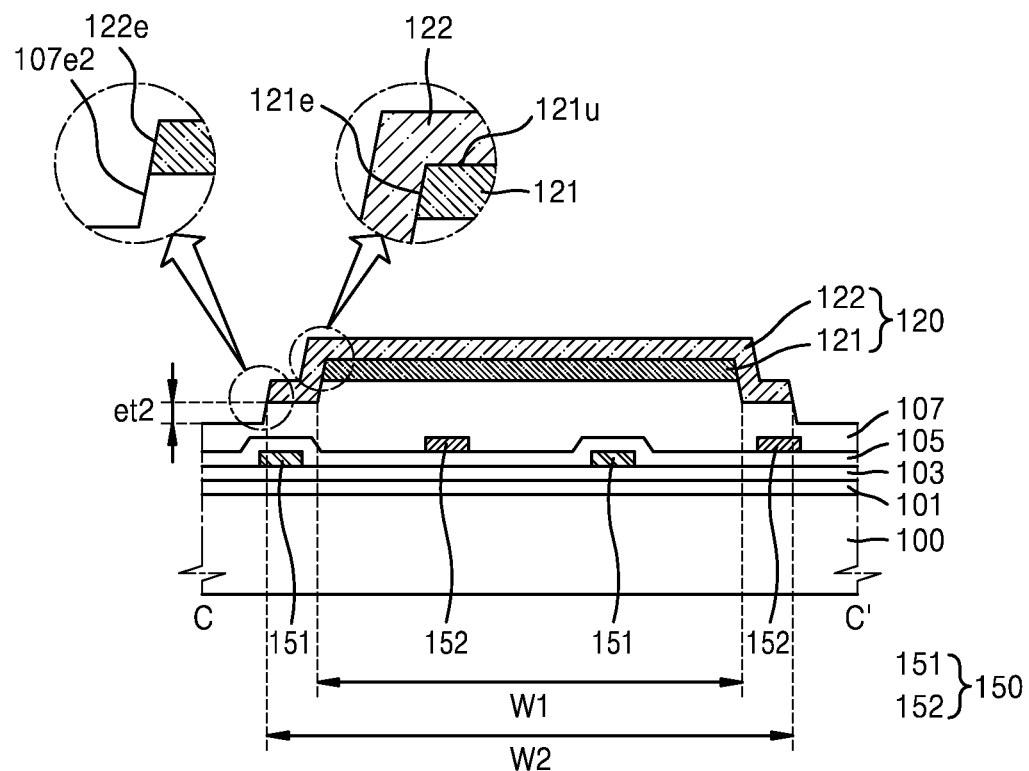
Figure 9:
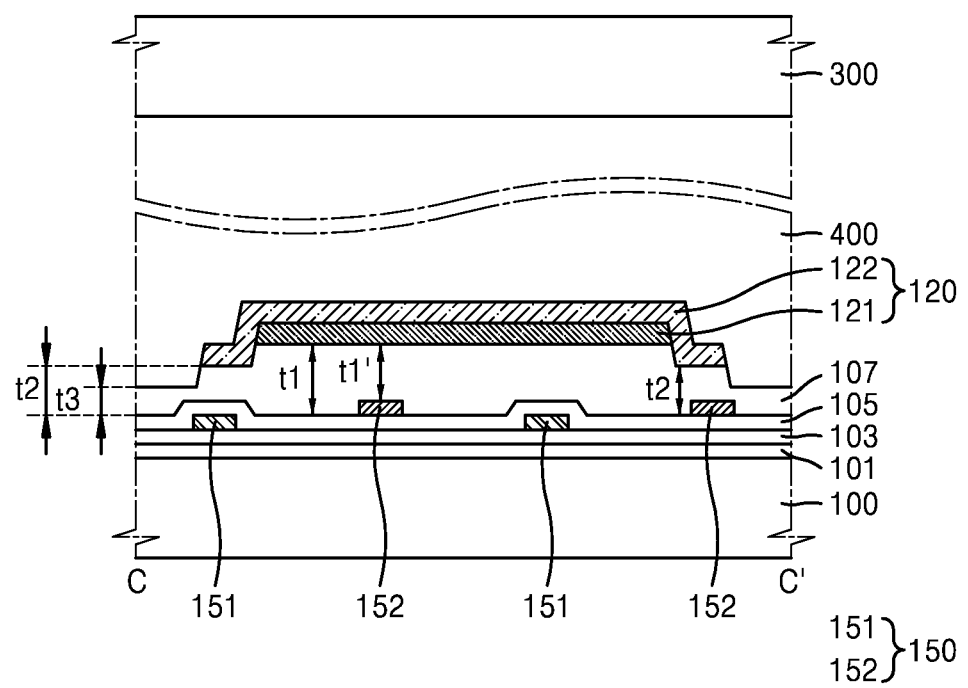
FIG. 9 is a schematic cross-sectional view of a portion of a display apparatus according to an exemplary embodiment.

Referring to FIGS. 8A to 8C, a second conductive material layer 122' is formed on the first conductive layer 121. The second conductive material layer 122' may include the same material as the driving voltage line PL and/or the contact metal layer CM (see FIG. 5).

Next, the photoresist PR is formed on the second conductive material layer 122'. Portions of the photoresist PR may each be formed through exposure and development. In FIG. 8A, the photoresist PR may be wider than the first conductive layer 121. Thus, the photoresist PR may completely cover an upper surface of the first conductive layer 121 and side surfaces of the first conductive layer 121. The portion of the second conductive material layer 122' having no photoresist PR formed thereon and exposed to the outside may be removed by an etching process.

After the etching process, the second conductive layer 122 may be formed as shown in FIG. 8B. Similar to the process described above with reference to FIG. 7C, a process of etching the second conductive material layer 122' may be performed from an upper portion of the second conductive material layer 122' towards a lower portion of the second conductive material layer 122'. In this regard, after the second conductive material layer 122' is etched, the second interlayer insulating layer 107 located under the second conductive material layer 122' may also be etched. In such a phenomenon, as the second conductive material layer 122' arranged on the second interlayer insulating layer 107 is continuously exposed to an etchant, etching may be performed simultaneously in a direction a and a direction b, and etching in the direction a may influence etching in the direction b.

The second interlayer insulating layer 107 having a step structure due to etching of the first conductive material layer 121' may have a dual step structure through etching of the second conductive material layer 122'. For example, a thickness of a portion of the second interlayer insulating layer 107 exposed to an etchant through etching of the second interlayer insulating layer 107 caused by etching of the second conductive material layer 122' may further decrease. However, in this case, the portion of the second interlayer insulating layer 107 arranged below the first conductive layer 121 and covered by the first conductive layer 121 may maintain a thickness obtained during the initial formation of the second interlayer insulating layer 107.

The second conductive layer 122 obtained by patterning may have a shape shown in FIG. 8C. After the etching process, the photoresist PR may be removed. Through the above etching process, a second step surface 107e2 may be formed in the second interlayer insulating layer 107. The second step surface 107e2 of the second interlayer insulating layer 107 may extend from a side surface 122e of the second conductive layer 122 towards the first substrate 100. Due to the second step surface 107e2 of the second interlayer insulating layer 107, a second step et2 having a certain height may be formed in the second interlayer insulating layer 107. The side surface 122e of the second conductive layer 122 and the second step surface 107e2 of the second interlayer insulating layer 107 formed by the same etching process may be coplanar. For example, as shown in FIG. 8C, in an exemplary embodiment, the side surface 122e of the second conductive layer 122 and the second step surface 107e2 of the second interlayer insulating layer 107 may be substantially aligned with each other. When formed, the sealing portion 400 may directly contact the second step surface 107e2 of the second interlayer insulating layer 107.

In an exemplary embodiment, the second conductive layer 122 may cover the first conductive layer 121. That is, the second conductive layer 122 may clad the side surface 121e of the first conductive layer 121 and an upper surface 121u of the first conductive layer 121. For example, an entirety of the first conductive layer 121 may be covered by the second conductive layer 122. In this case, a width W2 of the second conductive layer 122 may be greater than a width W1 of the first conductive layer 121.

Next, the sealing portion 400 and the second substrate 300 may be arranged on the power supply line 120. In an exemplary embodiment, the sealing portion 400 may be directly arranged on the power supply line 120, which may improve attachment. For example, the sealing portion 400 may make direct contact with the power supply line 120. The first substrate 100 and the second substrate 300 may be attached to each other through the sealing portion 400. During this process, the power supply line 120 located in the overlapping area ORA (see FIG. 6) may be pressed towards the first substrate 100. However, the second interlayer insulating layer 107 according to an exemplary embodiment has a first thickness t1, which is substantially the same as a thickness obtained during the initial formation, in an area in which the first conductive layer 121 is arranged. Thus, a short circuit may be prevented from being created between the plurality of second wires 152, even when the power supply line 120 is pressed towards the first substrate 100.

Although FIG. 9 shows a thickness t1' of the second interlayer insulating layer 107 arranged on the second wire 152 being less than the first thickness t1 of a portion of the second interlayer insulating layer 107 where no second wire 152 is arranged, in an exemplary embodiment, the thickness t1' may be substantially the same as the first thickness t1. The thickness t1' of the second interlayer insulating layer 107 may be greater than a second thickness t2 of a portion of the second interlayer insulating layer 107 where the second conductive layer 122 is directly arranged. Thus, a portion of the second interlayer insulating layer 107 directly contacting a lower surface of the second conductive layer 122 may be thinner than a portion of the second interlayer insulating layer 107 where the first conductive layer 121 is arranged. A third thickness t3 of a portion of the second interlayer insulating layer 107 where no power supply line 120 is arranged may be less than the first and second thicknesses t1 and t2 of portions of the second interlayer insulating layer 107 where the power supply line 120 is arranged. As described above, an upper portion of the second interlayer insulating layer 107 not covered by the first conductive layer 121 and the second conductive layer 122 may also be etched by two etching processes while the first conductive layer 121 and the second conductive layer 122 are patterned, and thus, a thickness of the second interlayer insulating layer 107 may decrease.

Figure 10:
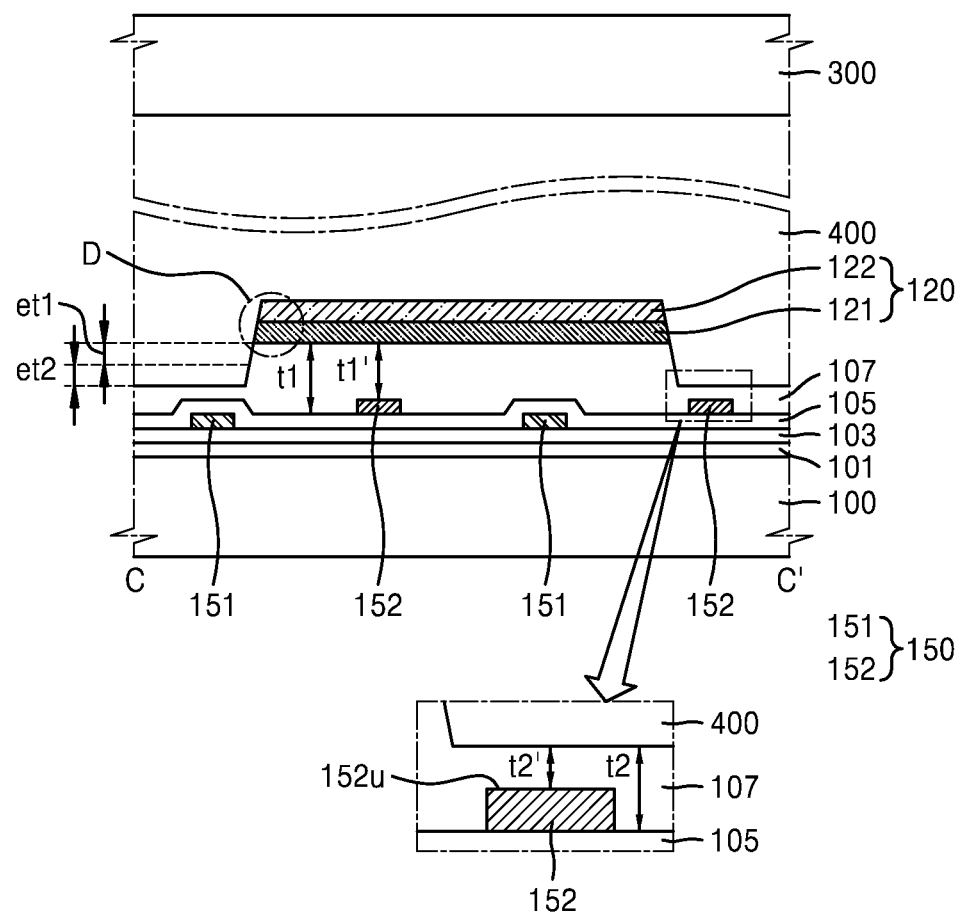
FIG. 10 is a schematic cross-sectional view of a portion of a display apparatus according to an exemplary embodiment.
Figure 11:
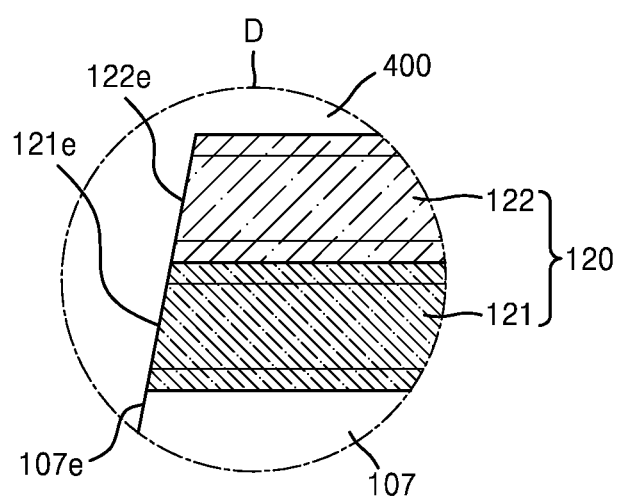
FIG. 11 is an enlarged cross-sectional view of portion D of FIG. 10.

FIG. 10 is a schematic cross-sectional view of a portion of a display apparatus according to an exemplary embodiment. FIG. 11 is an enlarged cross-sectional view of portion D of FIG. 10. FIG. 10 corresponds to a modified example of FIG. 9.

The exemplary embodiment of FIG. 10 is different from the exemplary embodiment of FIG. 9 in terms of a structure of the power supply line 120. Hereinafter, for convenience of explanation, differences in the power supply line 120 will be mainly described, and a repeated description of aspects and elements previously described may be omitted.

Referring to FIGS. 10 and 11, the power supply line 120 may include the first conductive layer 121 and the second conductive layer 122. In the power supply line 120 of FIG. 9 described above, the second conductive layer 122 clads the first conductive layer 121, whereas, in the power supply line 120 of FIG. 10, the side surface 121e of the first conductive layer 121 is exposed without being clad with the second conductive layer 122. That is, a width of the first conductive layer 121 and a width of the second conductive layer 122 may be substantially the same as each other, and the side surface 121e of the first conductive layer 121 and the side surface 122e of the second conductive layer 122 may be continuously formed. That is, the side surface 121e of the first conductive layer 121 and the side surface 122e of the second conductive layer 122 may be provided as the same continuous etched surface because the first conductive layer 121 and the second conductive layer 122 are patterned by the same etching process. In this regard, 'the same continuous etched surface' may be substantially planar or may have a curved shape with concave and convex portions.

In an exemplary embodiment, a step surface 107e is formed in the second interlayer insulating layer 107. The step surface 107e is formed by two etching processes while the first conductive layer 121 and the second conductive layer 122 are patterned. Referring to FIG. 11, the step surface 107e of the second interlayer insulating layer 107 may be continuously formed with the side surface 121e of the first conductive layer 121 and the side surface 122e of the second conductive layer 122. That is, the step surface 107e of the second interlayer insulating layer 107, the side surface 121e of the first conductive layer 121, and the side surface 122e of the second conductive layer 122 may be provided as the same continuous etched surface by the same etching process. In this regard, 'the same continuous etched surface' may be substantially planar or may have a curved shape with concave and convex portions, since the surfaces are formed by the same etching process, that is, a process of patterning the second conductive layer 122. For example, the step surface 107e of the second interlayer insulating layer 107 may extend from the side surface 122e of the second conductive layer 122 and the side surface 121e of the first conductive layer 121 toward the first substrate 100.

The first thickness t1 and t1' of the second interlayer insulating layer 107 where the power supply line 120 is arranged is greater than the second thickness t2 and t2' of the second interlayer insulating layer 107 where no power supply line 120 is arranged. In FIG. 10, t2 and t2' indicate thicknesses of the second interlayer insulating layer 107 in an area in which the second interlayer insulating layer 107 is not covered by the power supply line 120. More particularly, in this area, t2 indicates a thickness of the second interlayer insulating layer 107 from an upper surface of the second interlayer insulating layer 107 to a lower surface of the second interlayer insulating layer 107 adjacent to the second wire 152, and t2' indicates a thickness of the second interlayer insulating layer 107 from the upper surface of the second interlayer insulating layer 107 to an upper surface 152u of the second wire 152. A portion of the second interlayer insulating layer 107 where no power supply line 120 is arranged results from a portion of an upper surface etched together during a process of patterning the first conductive layer 121 and the second conductive layer 122. Although FIG. 10 shows the first and second thicknesses t1' and t2' of the second interlayer insulating layer 107 on the second wire 152 being less than the first and second thicknesses t1 and t2 of portions of the second interlayer insulating layer 107 where no second wire 152 is arranged, in an exemplary embodiment, the first and second thicknesses t1' and t2' may be substantially the same as the first and second thicknesses t1 and t2.

As described above, as the second interlayer insulating layer 107 is thicker in a portion where the power supply line 120 is arranged, the power supply line 120 and the fan-out portion 150 may be prevented from being shorted due to the sealing portion 400.

Figure 13:
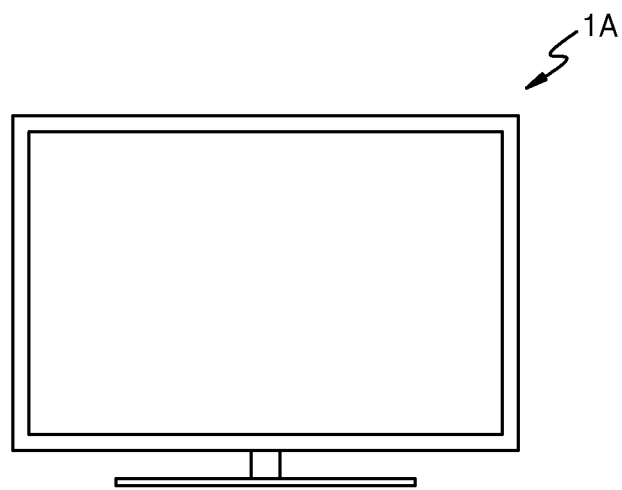
FIGS. 13 to 15 show electronic devices including a display apparatus according to exemplary embodiments.
Figure 14:
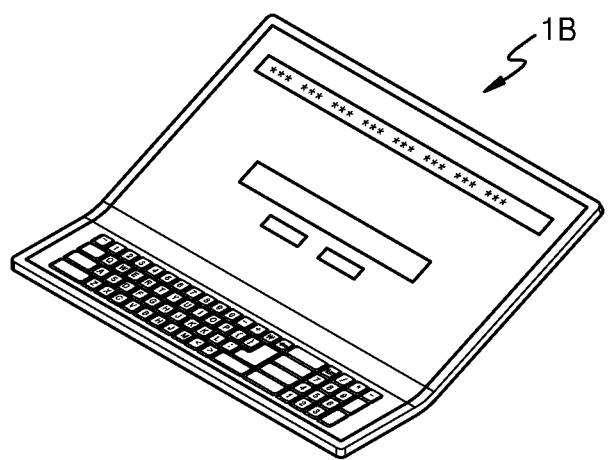
Figure 15:
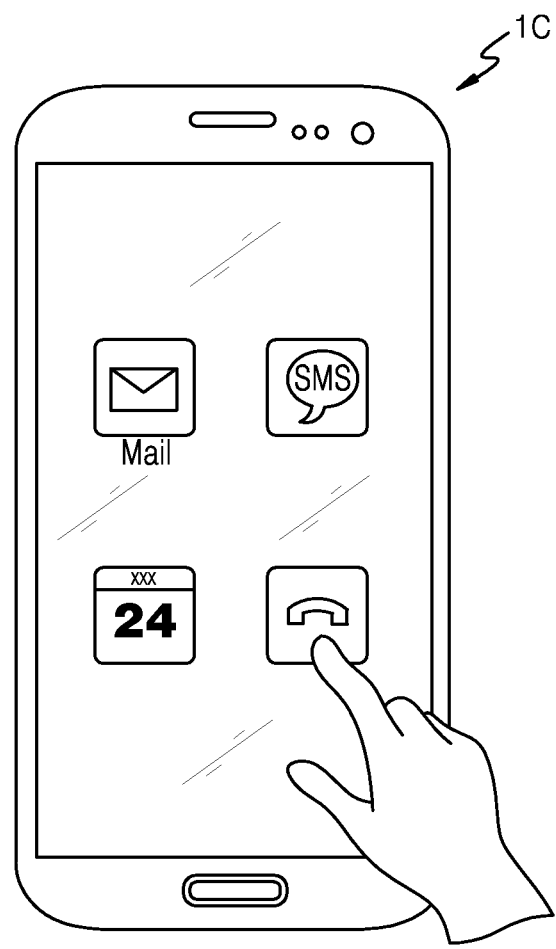

FIGS. 13 to 15 show electronic devices including a display apparatus according to exemplary embodiments.

The display apparatus including the above structure may be, for example, a monitor such as a television 1A as shown in FIG. 13, a notebook computer or foldable tablet personal computer (PC) 1B as shown in FIG. 14, or a portable display device 1C such as a mobile phone as shown in FIG. 15. Alternatively, the display apparatus may be used in a display portion included in an artificial intelligence speaker. However, the present disclosure is not limited thereto, and a structure according to the exemplary embodiments described herein may be applied to any electronic apparatus capable of providing an image.

According to exemplary embodiments, reliability of a display apparatus may be improved by preventing a short circuit from occurring between vertically stacked wires.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display apparatus, comprising:
   a first substrate comprising a display area and a peripheral area arranged on a side of the display area;
   a second substrate facing the first substrate;
   a fan-out portion arranged in the peripheral area and comprising a plurality of wires;
   a power supply line arranged over the fan-out portion and in the peripheral area;
   an insulating layer arranged between the plurality of wires and the power supply line; and
   a sealing portion arranged in the peripheral area,
   wherein the sealing portion surrounds the display area and attaches the first substrate and the second substrate to each other,
   wherein the peripheral area comprises an overlapping area in which the fan-out portion, the power supply line, and the sealing portion overlap one another, and the power supply line arranged in the overlapping area comprises a first conductive layer and a second conductive layer arranged on the first conductive layer.

2. The display apparatus of claim 1, wherein the second conductive layer clads an upper surface and a side surface of the first conductive layer.

3. The display apparatus of claim 2, wherein the second conductive layer is wider than the first conductive layer.

4. The display apparatus of claim 2, wherein the insulating layer comprises a first step surface extending from the side surface of the first conductive layer towards the first substrate.

5. The display apparatus of claim 4, wherein the insulating layer further comprises a second step surface extending from a side surface of the second conductive layer towards the first substrate.

6. The display apparatus of claim 5, wherein the sealing portion directly contacts the second step surface.

7. The display apparatus of claim 1, wherein, a first portion of the insulating layer where the first conductive layer is arranged is thicker than a second portion of the insulating layer where the first conductive layer is not arranged.

8. The display apparatus of claim 7, wherein, a third portion of the insulating layer directly contacting a lower surface of the second conductive layer is thinner than the first portion of the insulating layer where the first conductive layer is arranged.

9. The display apparatus of claim 1, wherein a side surface of the second conductive layer and a side surface of the first conductive layer are a same etched surface.

10. The display apparatus of claim 9, wherein a width of the second conductive layer is substantially the same as a width of the first conductive layer.

11. The display apparatus of claim 9, wherein the insulating layer comprises a step surface extending from the side surface of the second conductive layer and the side surface of the first conductive layer towards the first substrate.

12. The display apparatus of claim 11, wherein, a first portion of the insulating layer where the first conductive layer is arranged is thicker than a second portion of the insulating layer where the first conductive layer is not arranged.

13. The display apparatus of claim 1, further comprising:
a first inorganic insulating layer and a second inorganic insulating layer arranged in the peripheral area,
wherein the second inorganic insulating layer is arranged on the first inorganic insulating layer, and the insulating layer is arranged on the second inorganic insulating layer,
wherein the plurality of wires comprises a plurality of first wires arranged between the first inorganic insulating layer and the second inorganic insulating layer, and a plurality of second wires arranged between the second inorganic insulating layer and the insulating layer,
wherein the plurality of first wires and the plurality of second wires alternate with each other.

14. The display apparatus of claim 13, further comprising:
a pixel circuit comprising a thin film transistor and a storage capacitor arranged in the display area; and
a display element electrically connected to the pixel circuit,
wherein the thin film transistor comprises a semiconductor layer, a gate electrode at least partially overlapping the semiconductor layer, and an electrode layer arranged below the gate electrode and connected to the semiconductor layer,
wherein the storage capacitor comprises a lower electrode corresponding to at least a portion of the gate electrode and an upper electrode arranged over the lower electrode.

15. The display apparatus of claim 14, wherein the plurality of first wires comprises a same first material as the gate electrode, and the plurality of second wires comprises a same second material as the upper electrode.

16. The display apparatus of claim 14, wherein the display element comprises a pixel electrode, an opposite electrode arranged above the pixel electrode, and an intermediate layer arranged between the pixel electrode and the opposite electrode,
wherein the display apparatus further comprises a contact metal layer arranged between the electrode layer and the pixel electrode and electrically connecting the electrode layer and the pixel electrode to each other.

17. The display apparatus of claim 16, wherein the first conductive layer comprises a same material as the electrode layer.

18. The display apparatus of claim 16, wherein the second conductive layer comprises a same material as the contact metal layer.

19. The display apparatus of claim 16, wherein the power supply line supplies common power to the opposite electrode or supplies driving power to the thin film transistor.

20. The display apparatus of claim 1, wherein at least a portion of the sealing portion is arranged on the second conductive layer and directly contacts the second conductive layer.

* * * * *